US010199994B2

(12) United States Patent
Nagasaku

(10) Patent No.: US 10,199,994 B2
(45) Date of Patent: Feb. 5, 2019

(54) DOHERTY AMPLIFIER AND POWER AMPLIFIER

(71) Applicant: HITACHI KOKUSAI ELECTRIC INC., Tokyo (JP)

(72) Inventor: Toshiyuki Nagasaku, Tokyo (JP)

(73) Assignee: Hitachi Kokusai Electric Inc., Tokyo (JP)

(*) Notice: Subject to any disclaimer, the term of this patent is extended or adjusted under 35 U.S.C. 154(b) by 0 days.

(21) Appl. No.: 15/543,582

(22) PCT Filed: Jan. 16, 2015

(86) PCT No.: PCT/JP2015/051077
§ 371 (c)(1),
(2) Date: Jul. 14, 2017

(87) PCT Pub. No.: WO2016/113905
PCT Pub. Date: Jul. 21, 2016

(65) Prior Publication Data
US 2018/0026588 A1 Jan. 25, 2018

(51) Int. Cl.
*H03F 3/68* (2006.01)
*H03F 1/48* (2006.01)
*H03F 1/02* (2006.01)
*H03F 1/56* (2006.01)
*H03F 3/19* (2006.01)
(Continued)

(52) U.S. Cl.
CPC ............ *H03F 1/486* (2013.01); *H03F 1/0288* (2013.01); *H03F 1/483* (2013.01); *H03F 1/56* (2013.01);
(Continued)

(58) Field of Classification Search
CPC .................. H03F 1/0288; H03F 3/68
(Continued)

(56) References Cited

U.S. PATENT DOCUMENTS 8,581,665 B2 * 11/2013 Ui .................... H03F 1/0288
330/124 R
2003/0141933 A1 7/2003 Pengelly
(Continued)

FOREIGN PATENT DOCUMENTS

JP 2006-067176 A 3/2006
JP 2006-148780 A 6/2006
(Continued)

OTHER PUBLICATIONS

Kian Sen Ang, et al., "Multisection impedance-transforming coupled-line baluns", IEEE Transactions on Microwave Theory and Techniques, (U.S.A.), IEEE, vol. 51, No. 2, 2003, pp. 536-541.
(Continued)

*Primary Examiner* — Steven J Mottola
(74) *Attorney, Agent, or Firm* — Mattingly & Malur, PC

(57) ABSTRACT

A Doherty amplifier used in a Z ohm based system is provided with a carrier amplifier, a peak amplifier, and an impedance transforming line for transforming the load of the carrier amplifier when an input signal is small. The impedance transforming line has a characteristic impedance lower than Z ohms and equal to the optimum load impedance of the carrier amplifier. The load of the Doherty amplifier is lower than Z ohms. A power amplifier that obtains large output power by combining output powers from a plurality of Doherty amplifiers by a power coupling circuit is constructed.

8 Claims, 10 Drawing Sheets

(51) Int. Cl.
*H03F 3/24* (2006.01)
*H03F 3/60* (2006.01)

(52) U.S. Cl.
CPC ............... *H03F 3/19* (2013.01); *H03F 3/245* (2013.01); *H03F 3/602* (2013.01); *H03F 2200/09* (2013.01); *H03F 2200/423* (2013.01)

(58) Field of Classification Search
USPC ............................................. 330/124 R, 295
See application file for complete search history.

(56) References Cited

U.S. PATENT DOCUMENTS

| | | |
|---|---|---|
| 2010/0045385 A1 | 2/2010 | Pengelly |
| 2013/0127528 A1 | 5/2013 | Choi et al. |
| 2015/0130541 A1* | 5/2015 | Liao .................... H03F 1/0288 330/295 |

FOREIGN PATENT DOCUMENTS

| | | |
|---|---|---|
| JP | 2008-005321 A | 1/2008 |
| JP | 2012-500583 A | 1/2012 |
| JP | 2012-029239 A | 2/2012 |
| JP | 2013-243748 A | 12/2013 |
| WO | 2004/057755 A1 | 7/2004 |
| WO | 2005/093948 A1 | 10/2005 |

OTHER PUBLICATIONS

International Search Report of PCT/JP2015/051077 dated Apr. 21, 2015.
Japanese Office Action received in corresponding Japanese Application No. 2016-569200 dated Jun. 19, 2018.

* cited by examiner

100A

DOHERTY AMPLIFIER AND POWER AMPLIFIER

TECHNICAL FIELD

The present disclosure relates to a power amplifier, which is applicable to a wide-band Doherty amplifier, for example.

BACKGROUND ART

In electric circuits and electronic circuits, various amplifiers are used for amplifying electrical signals to a predetermined level. Among these amplifiers, amplifiers mainly used as the final-stage amplifier in a transmitter and having a large output power are referred to as power amplifiers.

In radio sets for wide-area communications, for example, the transmission output is increased, and hence this results in an increase in the output power of the power amplifier used for the transmitter of the radio set. Thus, electric power consumed by the power amplifier is considerably increased, and electric power consumed by the transmitter occupies a large part of the entire power. Therefore, in order to decrease the power consumption of the transmitter, to decrease power consumption of the power amplifier, i.e. to improve efficiency of the power amplifier is an important issue.

Commonly, in the transistor used in the amplifier, its efficiency is excellent near saturation compared with the case in which the output signal level is low, and the efficiency is referred to as saturation effects. On the other hand, in radio communications in these years, in order to improve frequency usage efficiency, advanced digital modulation methods, such as orthogonal frequency-division multiplexing (OFDM), tend to be adopted. However, signals subjected to such modulation methods have a considerably large peak to average power ratio (PAPR). In the power amplifier, in order to keep the distortion of signal waveforms small, it is necessary to take into account of the maximum electric power of signals, regarding the saturated electric power of the transistor for use. Consequently, the power amplifier is operated with average power far less than saturated electric power, and the efficiency is prone to be much poorer than the efficiency near the saturated power.

As methods of solving the problems and embodying highly efficient power amplifiers, various methods are invented. Among these methods, the Doherty amplifier is increasingly adopted as a power amplifier suitable for improving the efficiency of signals with a large PAPR.

In these years, at the base stations of mobile telephones, various frequency bands are used from a 700 MHz band to a 2 GHz band. It is desired that one device be enabled to handle a plurality of frequency bands. Therefore, embodying wide-band enabled devices is an important issue. In digital terrestrial broadcasting, channels are allocated to the ultra high frequency (UHF) band from 400 to 800 MHz bands. When a transmitter that is enabled to handle all the channels in these frequency bands is to be embodied by one model, this is effective on inventory management, for example, and hence it is expected to embody wide-band enabled transmitters. In order that in transmitters for both of the base stations of mobile telephones and digital terrestrial broadcasting, signals subjected to advanced digital modulation are used and the signals are transmitted at high output, power amplifiers for use in these transmitters are also similarly needed to handle wide frequency bands.

In order to enable the Doherty amplifier to handle wide frequency bands, Japanese Unexamined Patent Application Publication No. 2012-29239 (Patent Literature 1), for example, discloses the following. For example, a carrier amplifier and a peak amplifier, which have an output impedance of five ohms, are divided into ten. Thus, the output impedance of the carrier amplifier and the peak amplifier, which are divided, is 50 ohms, and a quarter-wavelength phase line using a line having a characteristic impedance of 50 ohms can be formed. With the use of a plurality of the Doherty circuits, the outputs of the Doherty circuits are coupled with a coupler, and a Doherty amplifier is formed.

CITATION LIST

Patent Literature

Patent Literature 1: Japanese Unexamined Patent Application Publication No. 2012-29239

Non-Patent Literature

Non-Patent Literature 1: Kian Sen Ang and two others, "Multisection impedance-transforming coupled-line baluns", IEEE Transactions on Microwave Theory and Techniques, (U.S.A.), IEEE, Vol. 51, No. 2, pp. 536-541, March 2003

SUMMARY OF INVENTION

Technical Problem

From the viewpoint of an increase in the number of parts and complicated power distribution circuits and combining circuits, for example, it is difficult to configure a power amplifier as disclosed in Patent Literature 1, in which a single amplifier is divided into low-output amplifiers, a plurality of the single amplifiers is used, and the outputs of these amplifiers are combined to obtain a higher output.

In the configuration of a wide-band Doherty amplifier (a single amplifier) using a line having a considerably small characteristic impedance and an impedance transformer matching circuit having a high impedance conversion rate, the line having a considerably small characteristic impedance and the impedance transformer matching circuit having a high impedance conversion rate occupy a large area on a substrate, resulting in a considerable increase in the mounting area.

An object of the present disclosure is to provide a technique that forms, on a substrate, a line necessary to configure a wide-band Doherty amplifier and having a considerably low characteristic impedance, and prevents the area of an impedance transformer matching circuit from being increased, even in the case of using a transistor having a low output impedance with a few ohm of an optimum load impedance.

Other objects and novel features will be apparent from the description of the present disclosure and the accompanying drawings.

Solution to Problem

The following is a brief outline of a representative aspect of the present disclosure.

That is, a Doherty amplifier for use in a Z-ohm system includes: a carrier amplifier; a peak amplifier; and an impedance transformer line that converts a load of the carrier amplifier when an input signal is small. The impedance transformer line has a characteristic impedance smaller than Z ohms and equivalent to an optimum load impedance of the carrier amplifier. A load of the Doherty amplifier is smaller than Z ohms.

Advantageous Effects of Invention

According to the Doherty amplifier, it is possible to form a line having a considerably low characteristic impedance on a substrate, and to prevent the area of an impedance transformer matching circuit from being increased.

DESCRIPTION OF EMBODIMENTS

Figure 1:
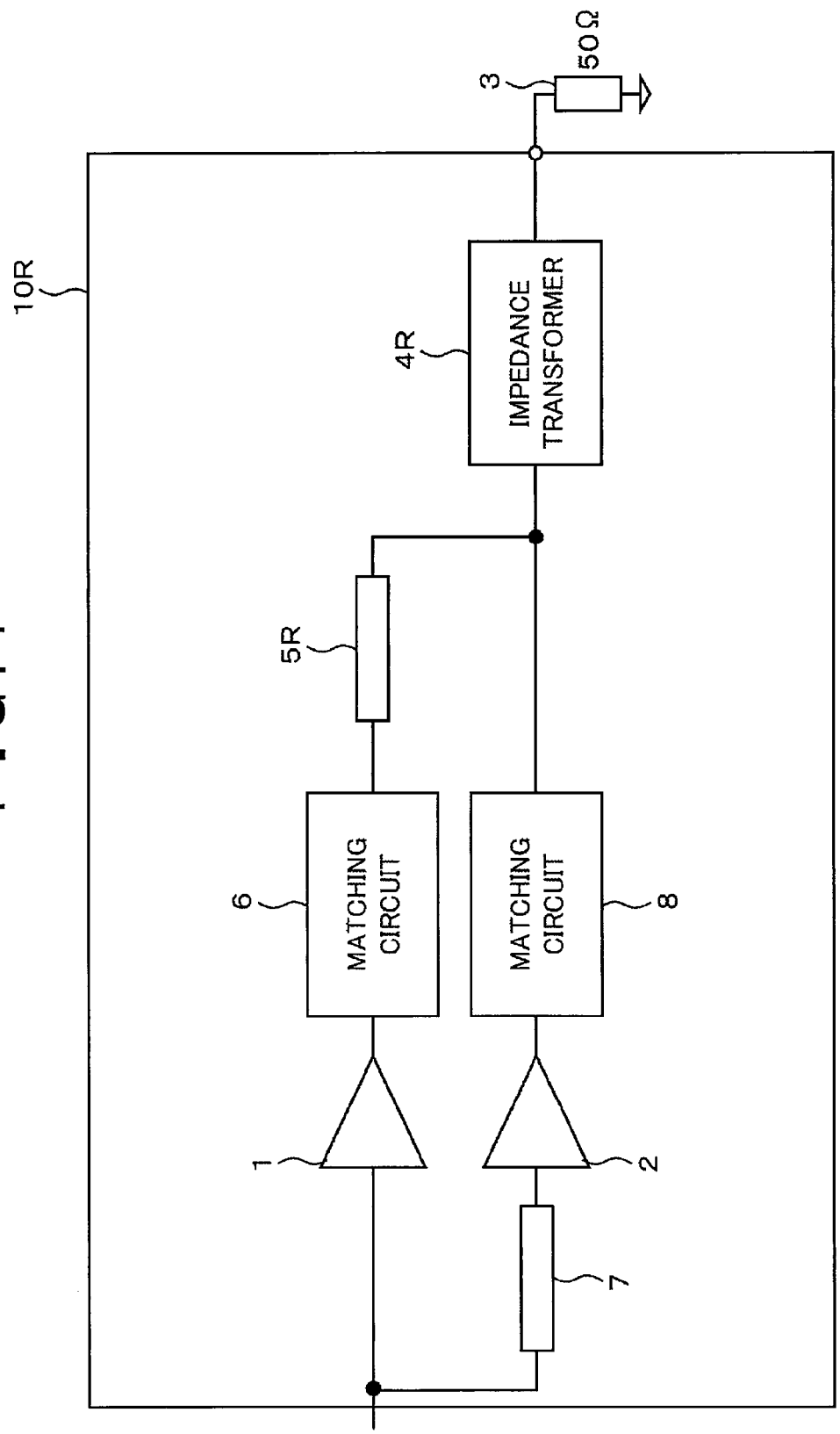
FIG. 1 is a block diagram for explaining a Doherty amplifier.

In the following, an embodiment and an example will be described with reference to the drawings. However, in the description below, the same components are designated the same reference numerals and signs, and the repeated description is sometimes omitted.

First, referring to FIGS. 1 to 3, a Doherty amplifier and its problem will be described.

Figure 2:
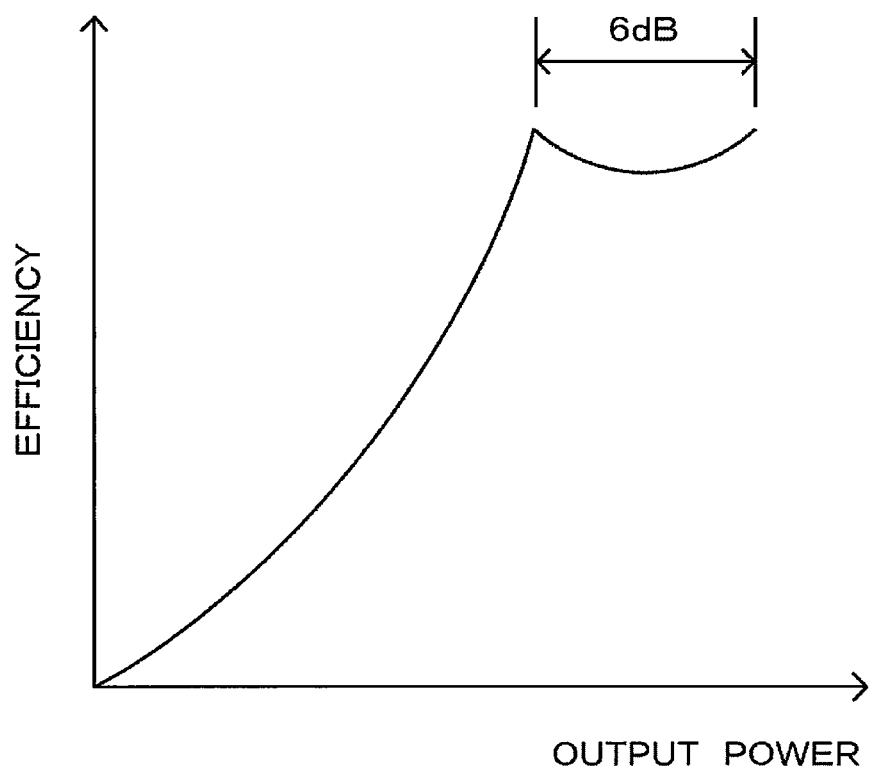
FIG. 2 is a diagram for explaining the efficiency characteristics of a Doherty amplifier.

FIG. 1 is a block diagram of the configuration of a Doherty amplifier. FIG. 2 is a diagram of the efficiency characteristics of the Doherty amplifier. FIG. 3 is a block diagram of a Doherty amplifier having wide-band characteristics.

A Doherty amplifier 10R is configured of two amplifiers, which are a carrier amplifier 1 and a peak amplifier 2. Typically, the carrier amplifier 1 is biased in class A or class AB, and the peak amplifier 2 is biased in class B or class C. In the case of a 50-ohm (Ω) system, a load 3 of the amplifier is often a load of 50 ohms. In the following, the operation of the Doherty amplifier 10R will be briefly described.

When the signal level inputted to the Doherty amplifier 10R is low, the peak amplifier 2 is turned to the Off-state, and only the carrier amplifier 1 is operated. In this state, the output impedance of the peak amplifier 2 is considerably high, and the output of a matching circuit 8 is also at a high impedance. Thus, an impedance transformer 4R is equivalently directly connected to the carrier amplifier 1 and a matching circuit 6. The impedance transformer 4R converts the 50-ohm load 3 into a 25-ohm load. The impedance of the 25-ohm load is further converted into a 100-ohm load through a quarter-wavelength transmission line 5R having a characteristic impedance of 50 ohms. Consequently, in a range of a low input signal level, the amplifier formed of the carrier amplifier 1 and the matching circuit 6 is operated with the 100-ohm load.

When the input signal level of the Doherty amplifier 10R is increased, the peak amplifier 2 is turned on. Thus, both of the carrier amplifier 1 and the peak amplifier 2 are operated. A phase compensation circuit (a phase compensation line) 7 is adjusted so that the outputs of both of the carrier amplifier 1 and the peak amplifier 2 are combined in phase. Since the impedance transformer 4R converts the 50-ohm load 3 into a 25-ohm load, a 50-ohm load is equivalently connected to both of the carrier amplifier 1 and the peak amplifier 2. The bias of the peak amplifier 2 is adjusted so that the peak amplifier 2 starts operation at the timing of saturation of the carrier amplifier 1, and hence the efficiency of the Doherty amplifier 10R shows the characteristics as shown in FIG. 2. As shown in FIG. 2, in the region in which the input signal is at a low level, only the carrier amplifier is operated, and the Doherty amplifier 10R is operated up to near saturation only with the carrier amplifier. Thus, the Doherty amplifier 10R is enabled to be highly efficiently operated even at a low signal level to some extent with respect to the maximum electric power.

The Doherty amplifier 10R uses the matching circuits 6 and 8 for matching the output impedances of the carrier amplifier 1 and the peak amplifier 2 with the impedance of the load. Since the matching circuits 6 and 8 have frequency responses, the matching circuits 6 and 8 function as matching circuits at specific frequency points. However, the matching circuits 6 and 8 are out of ideal operation at frequency points apart from the center frequency. This influence imposes limitation on the frequency range in which the Doherty amplifier 10R is operated. Moreover, the frequency responses of the matching circuits 6 and 8 and the frequency response of the quarter-wavelength transmission line 5R as well as the frequency response of the impedance transformer 4R are affected to one another, and this imposes limitation on the frequency range in which the Doherty amplifier 10R is operated as a Doherty amplifier. Consequently, it is difficult to increase the frequency band in which the Doherty amplifier 10R is operated.

Figure 3:
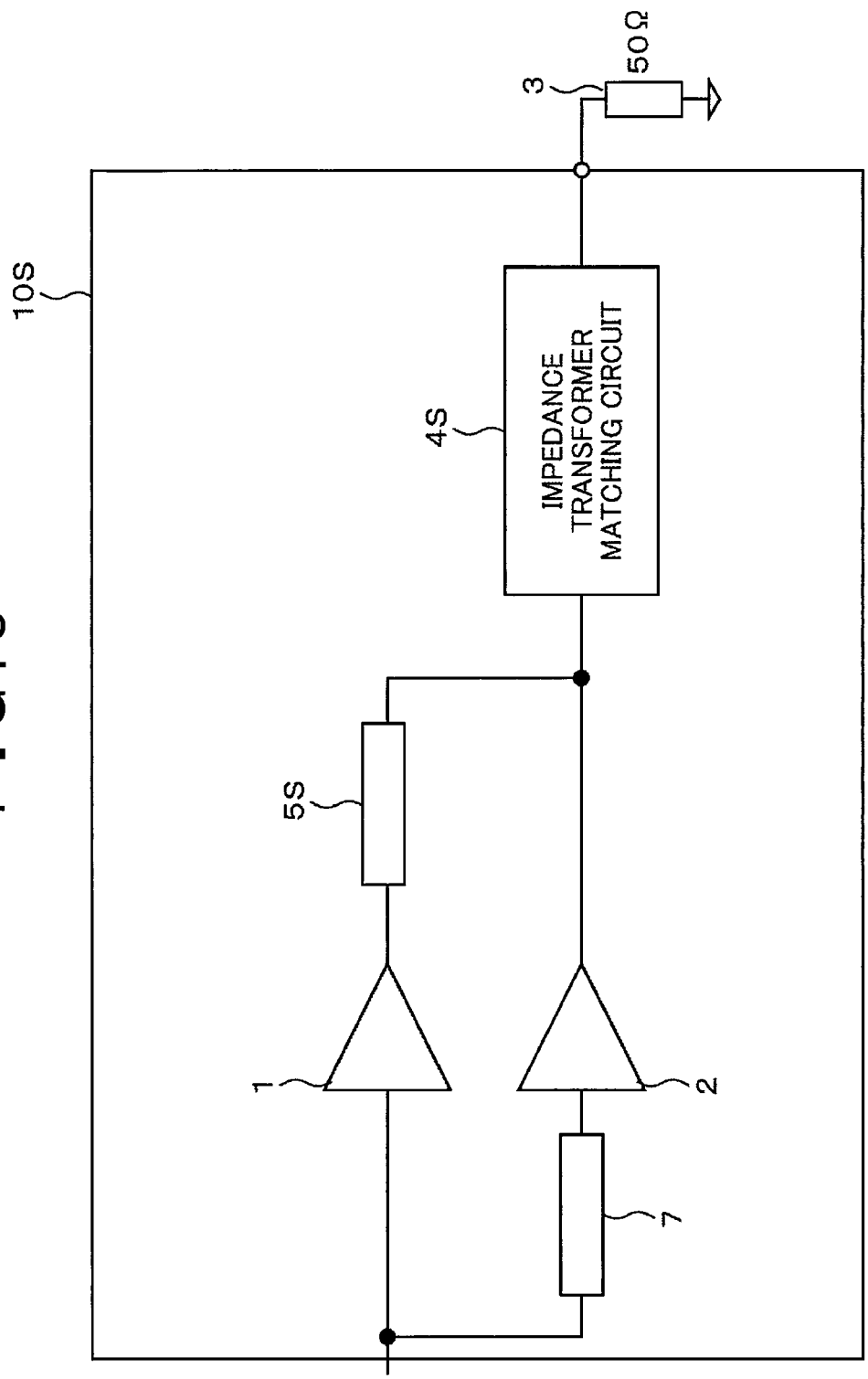
FIG. 3 is a block diagram for explaining a Doherty amplifier having wide-band characteristics.

As a solution to this problem, as shown in FIG. 3, a Doherty amplifier 10S with no use of the matching circuits 6 and 8 is thought. Instead of the quarter-wavelength transmission line 5R with a load of 50 ohms and the impedance transformer 4R, the Doherty amplifier 10S includes a quarter-wavelength transmission line 5S and an impedance transformer matching circuit 4S. Since the influence of the frequency response of the matching circuit is absent in the Doherty amplifier 10S, the frequency band can be widened more than the frequency band of the Doherty amplifier 10R.

The transistor used in a power amplifier with a large output typically has a considerably small optimum load impedance at which the optimum output or the optimum efficiency is obtained. The optimum load impedance is about a few ohms. For an example, in the case of a laterally diffused metal oxide semiconductor field-effect transistor (LDMOS FET) having a saturation output of about 600 W for use in a power amplifier in the UHF band, the optimum load impedance is five ohms or less.

On the other hand, the characteristic impedance of the quarter-wavelength transmission line 5S connected to a carrier amplifier 1 has to be matched with the optimum load impedance of the transistor for use in the carrier amplifier 1. Consequently, in the case in which the Doherty amplifier 10S as shown in FIG. 3 is configured using a high output transistor, the characteristic impedance of the quarter-wavelength transmission line 5S is considerably small.

Typically, in a microwave-band circuit, microstrip lines are used for transmission lines around the transistor. In the microstrip line, its width is determined from the characteristic impedance of a line and the dielectric constant and thickness of a substrate for use. In the same substrate, the line width is more increased as the characteristic impedance is lower. Consequently, the line having a considerably small impedance of five ohms or less as described above needs to have a considerably thick line width to a transmission line having an characteristic impedance of 50 ohms. Thus, a quarter-wavelength transmission line having a considerably thick line width has to be formed on a substrate configuring a Doherty amplifier, causing a problem in that the area of the substrate embodying the Doherty amplifier is increased.

In order to avoid the problem and prevent the line width from being increased, a measure is thought to decrease the line width with the use of a substrate having a high dielectric constant or a substrate having a thin thickness. However, in the case of a 50-ohm system, the load of the amplifier is typically 50 ohms. However, in the case of using a substrate having a high dielectric constant or a substrate having a thin thickness as described above, the width of a line having a characteristic impedance of 50 ohms is considerably narrow. The line having a narrow line width increases conductor losses, causing a problem that leads to the degradation of losses and the degradation of reliability due to a rise in heat. From these reasons, it is difficult to mount both of a low impedance line and a 50-ohm line on the same substrate as described above.

In order to widen the frequency band in the configuration of the Doherty amplifier 10S shown in FIG. 3, the impedance transformer matching circuit 4S also has to achieve a wide-frequency band response. As described above, since the optimum load impedances of the carrier amplifier 1 and the peak amplifier 2 are considerably small, the impedance transformer matching circuit 4S has to convert a low impedance into an impedance of 50 ohms. Typically, in order to achieve such impedance conversion in a wide band, the impedance transformer matching circuit 4S also needs a large area because a multistage matching circuit is used.

Figure 4:
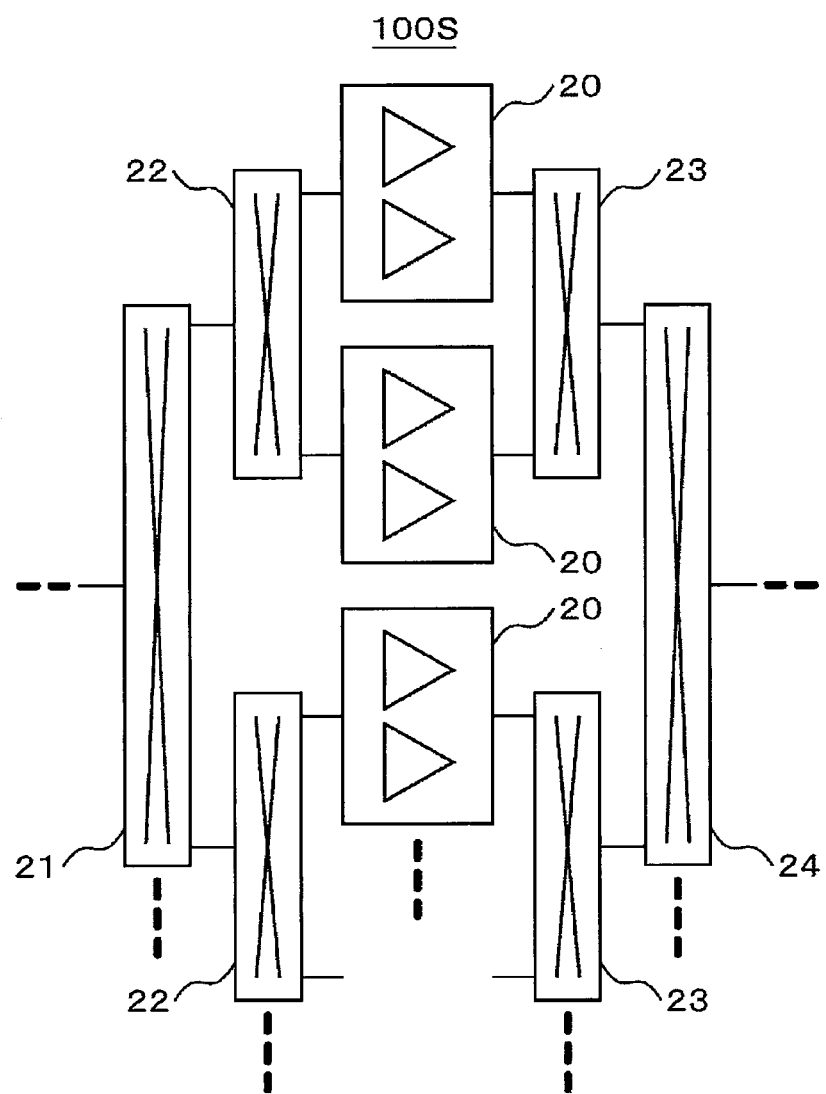
FIG. 4 is a block diagram for explaining a system that obtains a higher output by combining outputs of a plurality of single amplifiers.

Next, referring to FIG. 4, an exemplary configuration of a power amplifier will be described, in which a plurality of single amplifiers is used to combine electric power for obtaining a higher output. FIG. 4 is a block diagram of a power amplifier configured of a plurality of single amplifiers.

As shown in FIG. 4, in a power amplifier 100S that uses a plurality of single amplifiers to combine electric power, an input signal is divided at power distribution circuits 21 and 22, and inputted to a plurality of single amplifiers 20. The outputs of the plurality of single amplifiers 20 are combined at power combining circuits 23 and 24. In the case in which the wide-band Doherty amplifier 10S is used for the single amplifier 20, the Doherty amplifier 10S is configured of the quarter-wavelength transmission line 5S having a considerably thick line width and the impedance transformer matching circuit 4S in a large area. Thus, the power amplifier 100S also needs a large area.

Another problem of the wide-band amplifier is in that in the case of a wide-band amplifier covering a UHF band of frequencies of 400 to 800 MHz, for example, the second-order harmonic on the low frequency side (around a frequency of 400 MHz) is close to a frequency of 800 MHz, which is the upper limit of the passband. Thus, it is difficult to sufficiently reduce the harmonic in the amplifier, and the harmonic component to be output is increased.

Embodiment

Figure 10:
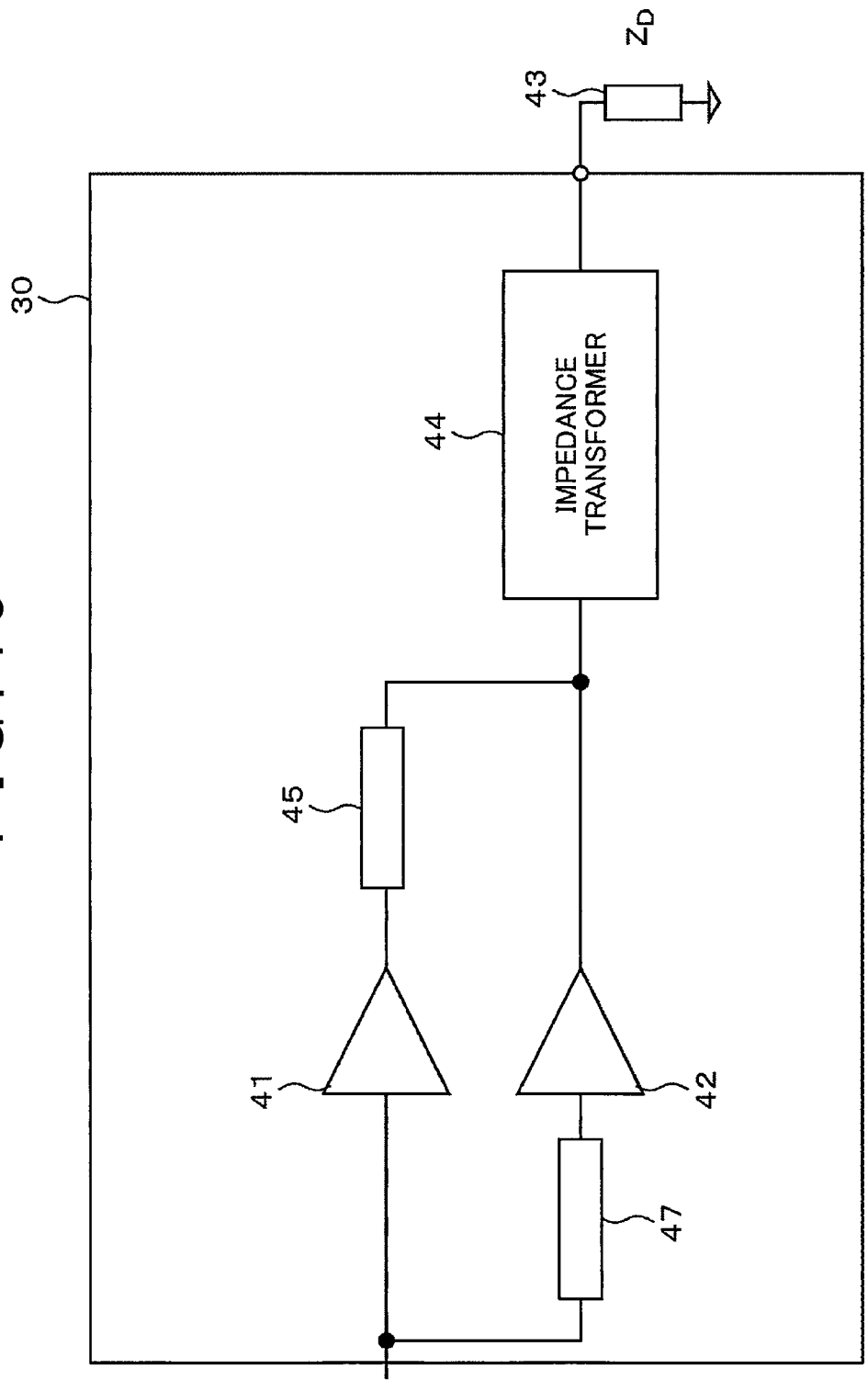
FIG. 10 is a block diagram for explaining a single amplifier according to an embodiment.

Referring to FIG. 10, a single amplifier according to an embodiment will be described. FIG. 10 is a block diagram of a single amplifier according to an embodiment.

A single amplifier 30 according to the embodiment is configured of two amplifiers, which are a carrier amplifier 41 and a peak amplifier 42. When the signal level inputted to the single amplifier 30 is low, the peak amplifier 42 is turned to the Off-state, and only the carrier amplifier 41 is operated. When the input signal level of the single amplifier 30 is increased, the peak amplifier 42 is turned on, and both of the carrier amplifier 41 and the peak amplifier 42 are operated. A phase compensation circuit 47 is adjusted so that the outputs of both of the carrier amplifier 41 and the peak amplifier 42 are combined in phase. An impedance transformer 44 converts a load ($Z_D$) 43 of the single amplifier 30, which is smaller than a system load ($Z_S$), into a characteristic impedance, which is smaller than the load 43 close to an optimum load impedance ($Z_F$) of the carrier amplifier 41. A quarter-wavelength transmission line 45 has a characteristic impedance ($Z_Q$) close to the optimum load impedance of the carrier amplifier 41. Here, a relationship $Z_S > Z_D > Z_Q \approx Z_F$ is held. When the signal level to be inputted is low, the impedance transformer 44 and the quarter-wavelength transmission line (the impedance transformer line) 45 convert the impedance of the load 43.

The quarter-wavelength transmission line 45 is desirably directly connected to the output terminal of the carrier amplifier 41 and the output terminal of the peak amplifier 42 (more precisely, the quarter-wavelength transmission line 45 is connected to the output terminals of the transistors configuring these amplifiers). Note that, there are not a few unintentional parasitic components, which are derived from the package of transistors or substrate level packaging, and additional provision of a circuit may be possible for the purpose of compensating fluctuations in these components.

Figure 5:
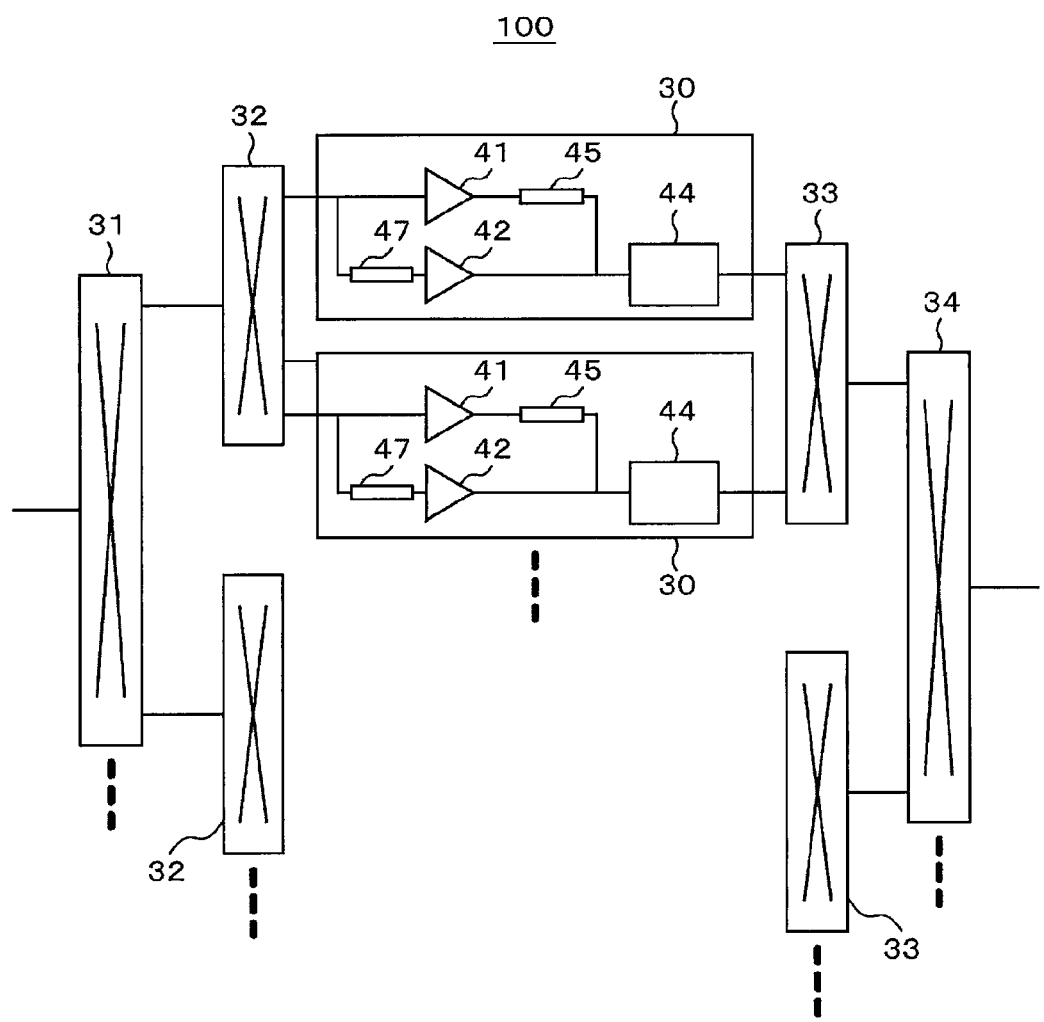
FIG. 5 is a block diagram for explaining a power amplifier according to an embodiment.
Figure 6:
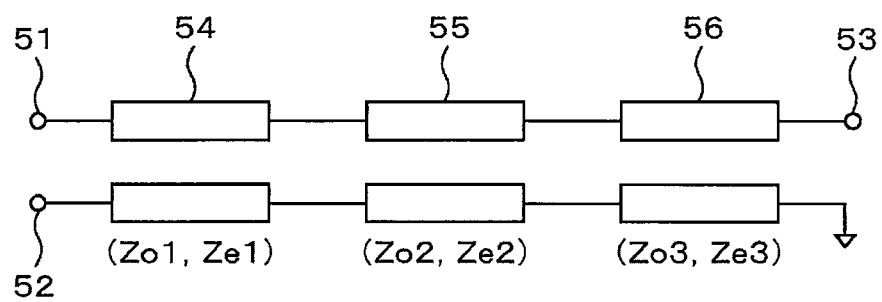
FIG. 6 is a diagram for explaining the principle of a balun circuit used in the power amplifier according to the embodiment.

Referring to FIGS. 5 and 6, a power amplifier according to the embodiment will be described. FIG. 5 is a block diagram of a power amplifier according to the embodiment. FIG. 6 is a diagram for explaining the principle of a balun circuit used in the power amplifier according to the embodiment. The case of using the power amplifier in a most typical 50-ohm system will be described.

A power amplifier 100 according to the embodiment is a system that uses a plurality of single amplifiers similarly to the power amplifier 100S shown in FIG. 4 and combines the outputs of the single amplifiers for obtaining a higher output, which is the premise. In the power amplifier 100, two or more single amplifiers 30 configured of a Doherty amplifier are used and the outputs of the single amplifiers 30 are combined.

At this time, in the case in which the optimum load impedance ($Z_F$) of a carrier amplifier 41 or a peak amplifier 42 of the single amplifier 30 is about a few ohms, the characteristic impedance ($Z_Q$) of a quarter-wavelength transmission line 45 is also considerably small ($Z_Q \approx Z_F$). Therefore, in the embodiment, as a substrate configuring the quarter-wavelength transmission line 45, the following substrate is used: a substrate having a high dielectric constant, on which a low impedance line described above can also be formed; a substrate having a thin substrate thickness; or a substrate in combination of them. At this time, when a line having a characteristic impedance of 50 ohms, which is an impedance the same as the system load ($Z_S$), is embodied on the same substrate, the line width is considerably narrow. Thus, the output impedance ($Z_U$) of the single amplifier 30 is restricted to an impedance that is smaller than 50 ohms and can embody a transmission line having a sufficient line width and an equivalent characteristic impedance. Hence, this secures sufficient line width in a transmission line used in the output circuit of the single amplifier 30.

Under the conditions in which the output impedance ($Z_U$) of the single amplifier 30 is not 50 ohms, when the single amplifier 30 is applied to a 50-ohm system, a mismatch occurs between the system and the single amplifier 30. Therefore, in the embodiment, a power combining circuit 33 is provided with a function of combining electric power and a function of impedance conversion. That is, the power combining circuit 33 converts the impedance from $Z_U$ into 50 ohms while combining the outputs of two single amplifiers 30. Note that, the characteristics of the single amplifier 30 possibly fluctuate due to the deviation of the characteristics of the transistor used in the carrier amplifier 41 or the peak amplifier 42. In the manufacturing processes, in order to prevent faulty characteristics of the entire power amplifier due to the influence of these fluctuations in the characteristics, the single amplifier 30 is inspected, and selection is made or the characteristics are adjusted, as necessary. To this end, in order to easily confirm the characteristics, the single amplifier 30, a power distribution circuit 32, and the power combining circuit 33 are manufactured on separate substrates. Since the single amplifier 30 and the power combining circuit 33 are formed on separate substrates, the power combining circuit 33 can be formed on a substrate having a dielectric constant and substrate thickness that can provide $Z_U$ and a 50-ohm line in a practical line width, and hence an increase in losses due to a considerably narrow line width can be prevented.

In the embodiment, a balun (balanced to unbalanced converter) circuit is used for the power distribution circuit 32 and the power combining circuit 33 to form a push-pull configuration. Thus, the second-order harmonic component can be cancelled at the balun circuit, allowing a reduction in the second-order harmonic component produced in the wide-band Doherty amplifier.

The power distribution circuit 32 may be formed in the configuration similar to the configuration of the power combining circuit 33. However, the power distribution circuit 32 does not need to have the impedance conversion function, a sufficient fractional bandwidth can be obtained using a known marchand balun.

A power distribution circuit 34 performs multi-combination in a combination of a 50-ohm hybrid (branchline coupler) or a Wilkinson coupler. Note that, in the description above, the power combining circuit 33 is provided with the impedance conversion function. However, it is without saying that even though impedance conversion is also performed at the power combining circuit 34 or a power combining circuit in the later stage, as necessary, similar effects can be obtained.

In the Doherty amplifier, in order to obtain highly efficient characteristics, which are its characteristics, the load-side impedance connected to the peak amplifier 41 and the carrier amplifier 42 in the single amplifier 30 has to be brought close to the optimum load impedances of the peak amplifier 41 and the carrier amplifier 42. This impedance is an impedance, in which the impedance of the final output load is connected to the single amplifier 30 through the power combining circuits 33 and 34 and further converted at an impedance transformer 44 in the single amplifier 30. At this time, since the frequency responses of the impedances of the power combining circuits 33 and 34 and the frequency response of the impedance transformer 44 are affected, these circuits have to be designed to handle a wide band.

Typically, the impedance transformer 44 uses an impedance transformer in a multi-stage configuration typified by the Klopfenstein Taper in order to obtain a wide-frequency band response. Its distributed constant is the approximation of lines continuously changed. In order to keep excellent characteristics, the circuit needs more stages as the impedance conversion rate is greater. However, in the embodiment, since the output impedance ($Z_U$) of the single amplifier 30 is lower than an impedance of 50 ohms, the impedance conversion rate is lower than in the impedance transformer 4R or the impedance transformer matching circuit 4S, allowing a decrease in the number of stages of the impedance transformer 44, i.e. a reduction in size.

In the embodiment, the power combining circuit 33 is also provided with the function of converting the output impedance of the single amplifier 30 into an impedance of 50 ohms. However, this impedance conversion has to be performed in a wide band. In order to achieve wide-band impedance conversion, the balun used in the embodiment is formed in a multi-stage configuration as shown in FIG. 6. In the balun used in the embodiment, the output signal of the single amplifier 30 is inputted to input terminals 51 and 52. Coupled circuits 54, 55, and 56 configure a multi-stage balun circuit. To an output terminal 53, a differential signal between the signals inputted to the input terminals 51 and 52 is outputted. In the coupled circuits like two parallel lines, the characteristics are determined by even-mode characteristic impedances ($Z_{e1}$, $Z_{e2}$, $Z_{e3}$) and odd-mode characteristic impedances ($Z_{o1}$, $Z_{o2}$, $Z_{o3}$). According to Non-Patent Literature 1, at this time, the entire balun circuit can be subjected to mode decomposition regarding the balun circuit as a quarter-wavelength coupled line in one stage, and the odd-mode characteristic impedance ($Z_{oo}$) and the even-mode characteristic impedance ($Z_{oe}$) are obtained based on Equation (1) below.

[Equation 1]

$$Z_{oo} = \frac{Z_{o1} Z_{o3}}{Z_{o2}} \qquad (1)$$

$$Z_{oe} = \frac{Z_{e1} Z_{e3}}{Z_{e2}}$$

In order to form the quarter-wavelength coupled line in one stage in an ideal balun, the impedances $Z_{oo}$ and $Z_{oe}$ have to satisfy Equation (2) below.

[Equation 2]

$$Z_{oo} = \sqrt{\frac{Z_{in} Z_{out}}{2}} \qquad (2)$$

$$Z_{oe} = \infty$$

Here, $Z_{in}$ is the impedances of the input terminals 51 and 52, and $Z_{out}$ is the output impedance of the output terminal 53.

Therefore, regarding the even-mode characteristic impedance, selection only has to be made in which $Z_{e1}$ and $Z_{e3}$ are increased as much as possible at the coupled circuits 54 and 56, and $Z_{e2}$ is decreased as small as possible at the coupled circuit 55. Regarding the odd-mode characteristic impedance, similarly to a typical filter, a filter can be designed as a broad filter having Chebyshev characteristics (equi-ripple characteristics), for example. The design approaches of the Klopfenstein Taper include a symmetric type in which $Z_{o1}$ is equal to $Z_{o3}$ and $Z_{o2}$ is smaller than others, an asymmetric type in which impedances are monotonously changed as $Z_{o1} < Z_{o2} < Z_{o3}$, and an intermediate type between the symmetric type and the asymmetric type.

As described above, the coupled lines configuring the balun is regarded as a multi-stage impedance transformer line that performs impedance conversion on quarter-wavelength transmission lines with the characteristic impedances ($Z_{o1}$, $Z_{o2}$, $Z_{o3}$), and the odd-mode characteristic impedances ($Z_{o1}$, $Z_{o2}$, $Z_{o3}$) are appropriately set. Hence, a balun circuit can be embodied to perform wide-band impedance conversion. Note that, the odd-mode characteristic impedances for wide-band impedance conversion can be embodied by ones having characteristics similar to the Chebyshev characteristics, for example, used in a wide-band multi-stage quarter-wavelength impedance transformer. Note that, in the description of the multi-stage balun above, the balun with a three-stage connection is described. However, in order to obtain much more excellent characteristics, coupled circuits in a four stage or more may be connected.

In the description above, the description is made using the most typical 50-ohm system. However, also in the case in which the impedance that is needed by a system is an impedance other than 50 ohms (e.g. 75 ohms), similar effects can be obtained.

As described above, in the embodiment, the value of the output impedance of the single amplifier is made smaller than the value of the system load (e.g. 50 ohms), and the impedance conversion function necessary in the power combining circuit is provided, and hence the width of the output line can be prevented from being narrowed in the single amplifier. Moreover, the substrate suited to embodying a low impedance line can be selected, and hence an increase in the circuit area due to a considerably thick line width can be prevented. It is possible to keep a small impedance conversion rate of output in power amplification of the single amplifier, and hence the area of the impedance transformer used at the output circuit in the single amplifier can be prevented from being increased. Consequently, the embodiment is also applicable to a high output power amplifier, which is difficult to obtain necessary output with a single amplifier like transmitters for digital terrestrial broadcasting.

Moreover, as another effect of the embodiment, a balun circuit is used for the power distribution circuit and the synthesizing circuit, and the second-order harmonic is cancelled using the output side balun circuit, and hence the second-order harmonic can be decreased.

The balun circuit used in the power combining circuit is formed in a multi-stage configuration, and this allows a balun circuit having wide-band impedance conversion characteristics to be embodied. Thus, excellent characteristics can be obtained in a wide band also in the Doherty amplifier sensitive to fluctuations in the load impedance.

Example

Figure 7:
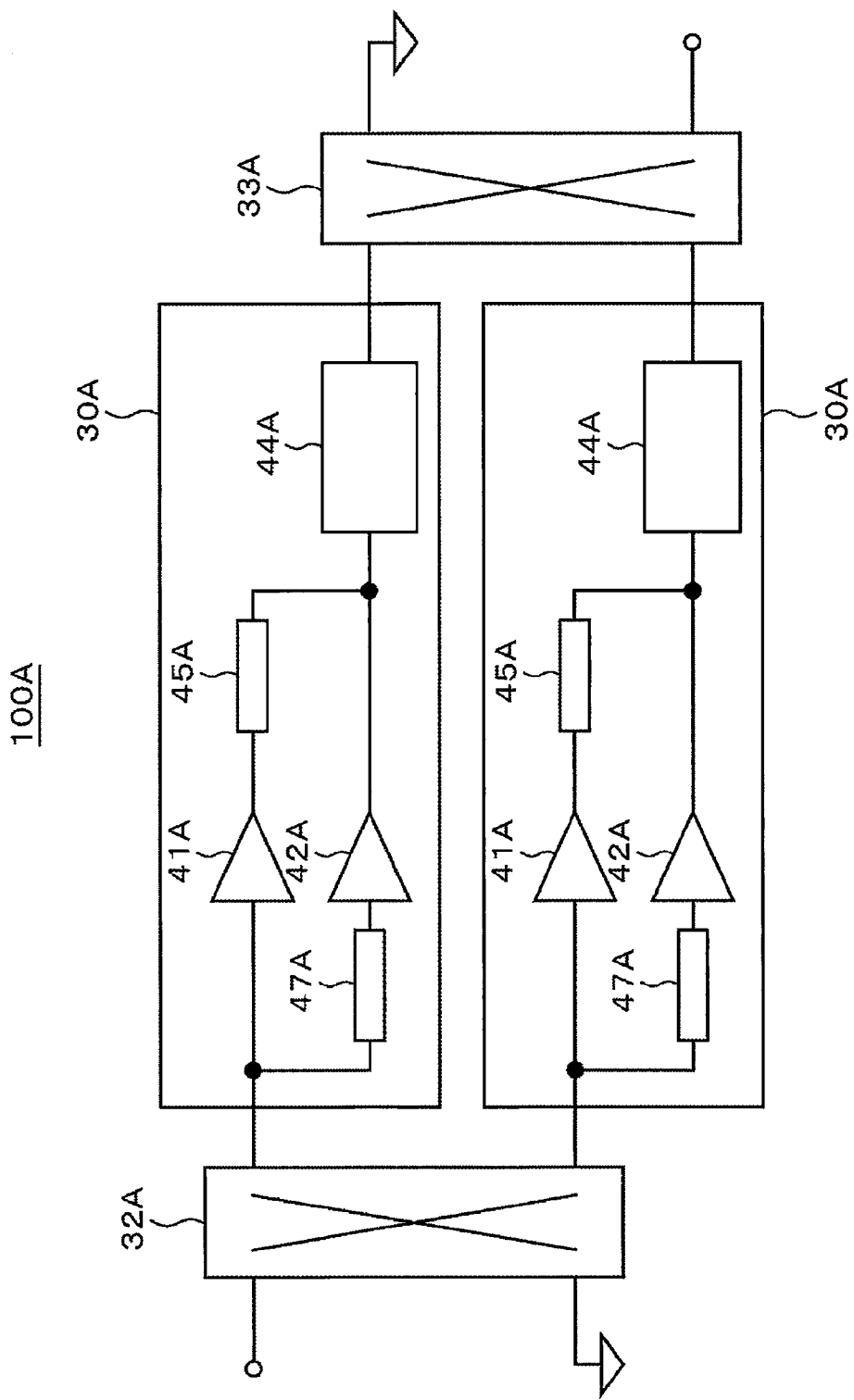
FIG. 7 is a block diagram for explaining a power amplifier according to an example.
Figure 8:
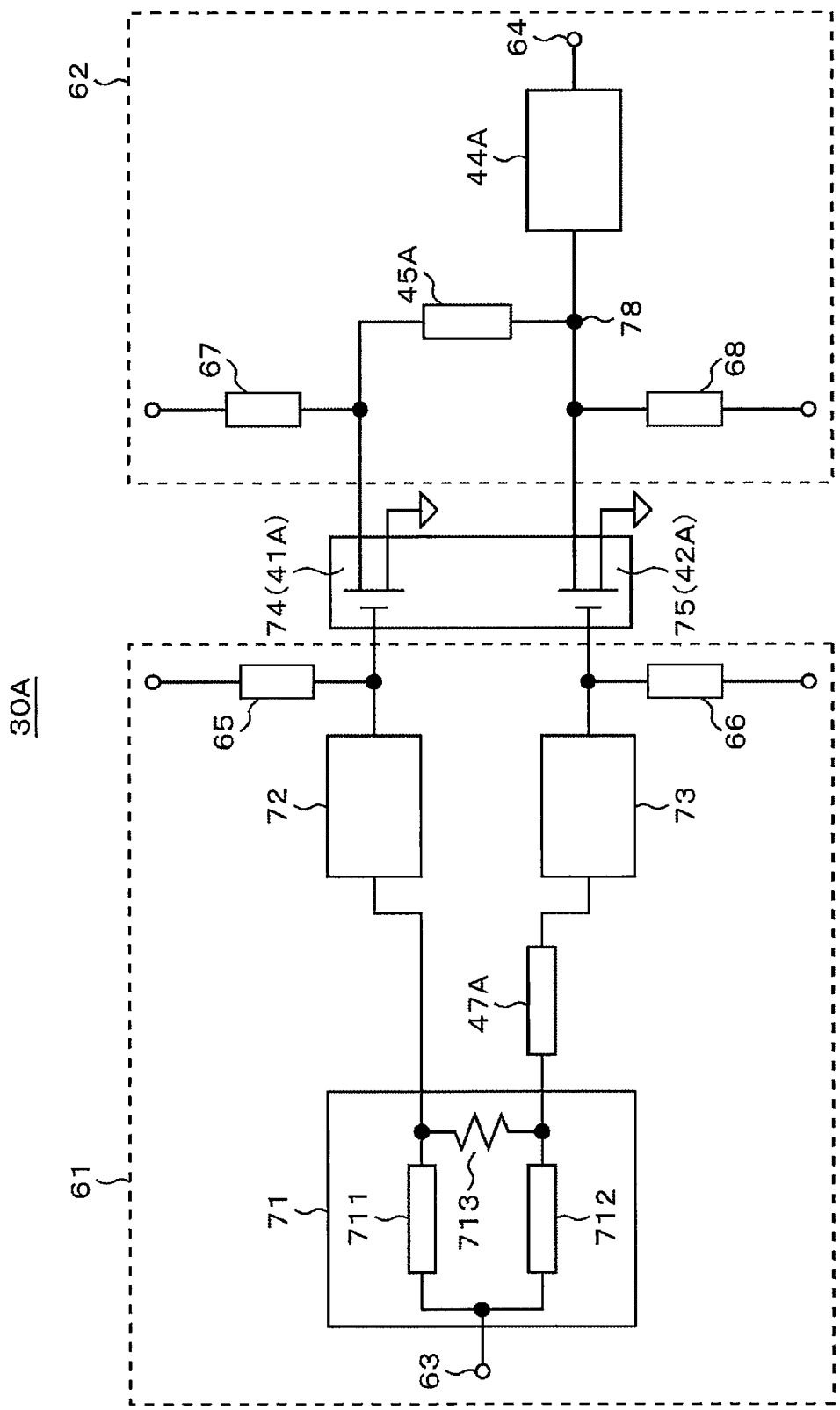
FIG. 8 is a schematic diagram for explaining a Doherty amplifier used in the power amplifier according to the example.
Figure 9:
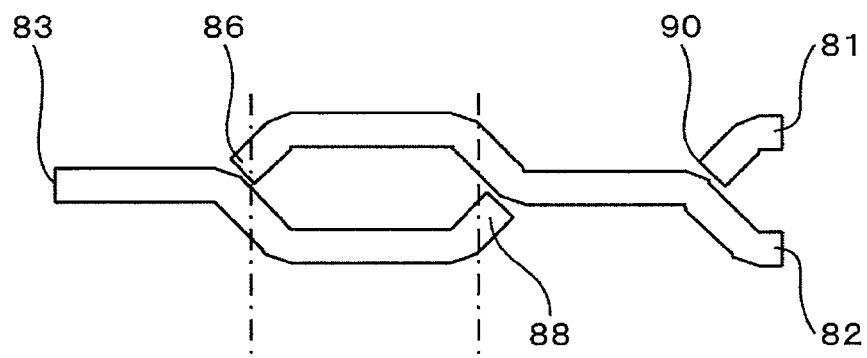
FIG. 9 is an outside diagram for explaining an exemplary configuration of a balun circuit used in the power amplifier according to the example.
Figure 9:
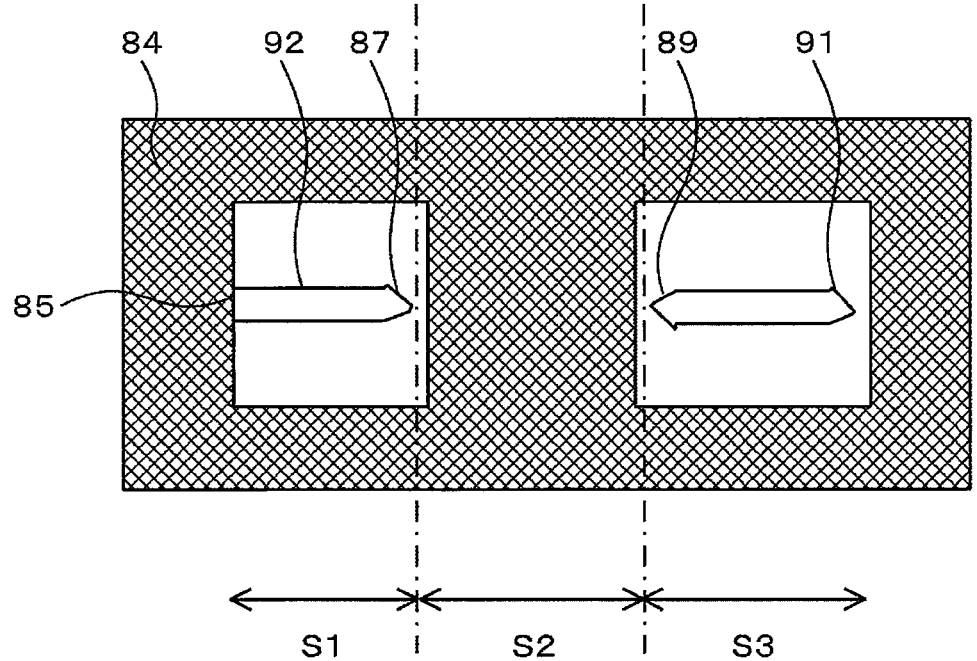

Referring to FIGS. 7 to 9, a power amplifier according to an example of the embodiment will be described. FIG. 7 is a block diagram of the configuration of a power amplifier according to an example. FIG. 8 is a block diagram of the configuration of a single amplifier according to the example. FIG. 9 is an outside diagram of the configuration of a balun circuit according to the example. FIG. 9(A) is the pattern of the front surface, and FIG. 9(B) is the pattern of the back surface.

In a power amplifier 100A according to the example, a power distribution circuit 32A on the input side and a power combining circuit 33A on the output side are configured of balun circuits. The power distribution circuit 32A is designed to have an input/output impedance of 50 ohms. The power combining circuit 33A is designed to have an input impedance of 12.5 ohms and an output impedance of 50 ohms. The power amplifier 100A is used in a 50-ohm system (e.g. a transmitter).

A single amplifier 30A is configured of a Doherty amplifier. The power of an input signal inputted to an input terminal 63 is distributed at a power distribution circuit 71 configured of a Wilkinson circuit, for example, and then converted into a desired impedance at matching circuits 72 and 73. The power distribution circuit 71 is configured of quarter-wavelength transmission lines 711 and 712 and a resister 713. Field effect transistors (FETs) 74 and 75 configure a carrier amplifier 41A and a peak amplifier 42A, respectively. The output of the carrier amplifier 41A (the FET 74) is directly connected to a quarter-wavelength transmission line 45A through no matching circuit. A bias voltage is applied to the gates of the FETs 74 and 75 through resister elements 65 and 66. A power supply voltage is applied to the outputs of the FETs 74 and 75 through resister elements 67 and 68. Note that, a quarter-wavelength transmission line (a phase compensation circuit) 47A is disposed between the power distribution circuit 71 and the matching circuit 73 for adjusting the phases of the output of the carrier amplifier 41A and the output of the peak amplifier 42A. Since the optimum load impedance of the FET used in the single amplifier 30A is small, which is a few ohms (e.g. five ohms), the characteristic impedance of the quarter-wavelength transmission line 45A is also considerably small, which is a few ohms (e.g. five ohms). The signal of the carrier amplifier 41A (the FET 74) is coupled to the signal of the peak amplifier 42A (the FET 75) at a node 78. The impedance transformer 44A converts the impedance of a load so that the impedance of the node 78 is the optimum. As described above, since the input impedance of the power combining circuit 33A is 12.5 ohms, the single amplifier 30A is equivalently connected to a load of 12.5 ohms. Note that, a LDMOSFET or GaAsFET can be used for the FET, for example. The quarter-wavelength transmission lines 45A, 47A, 711, and 712 are configured of lines, such as microstrip lines and strip lines, which transmit signals in transverse electro magnetic wave (TEM) mode.

The single amplifier 30A has an input impedance of 50 ohms, and has a configuration equivalent to the configuration of a typical Doherty amplifier connected to the FETs 74 and 75 through the matching circuits 72 and 73. Thus, for a substrate 61 used for the input circuit, a substrate having a dielectric constant of about 2 to 6 can be used. On the other hand, since the quarter-wavelength transmission line 45A having a low characteristic impedance close to the optimum load impedance of the FET has to be formed on a substrate 62 on the output side, a substrate having a high dielectric constant, or a substrate having a thin thickness, which are suited to configuring this line, is used. For such a substrate, a ceramic substrate having a dielectric constant of about 10, for example, can be used.

In the case in which a 50-ohm line is formed on a substrate that can embody a low characteristic impedance as described above, although its line width is narrowed, in the example, the single amplifier 30A is equivalently connected to a load of 12.5 ohms as described above. Thus, even though the substrate 62 is configured using a substrate as described above, a line can be embodied with no use of a transmission line having an extremely narrow line width. Moreover, the impedance matching circuit 44A converts the load impedance of the single amplifier 30A into the optimum impedance of the node 78. However, the load impedance is only has to be 12.5 ohms. Thus, compared with the case of converting the impedance into an impedance of 50 ohms, the impedance matching circuit 44A can be made smaller.

As shown in FIG. 9, the balun of the power combining circuit 33A according to the example is configured of coupled lines in patterns on the front and back surfaces of a substrate. The substrate, on which the power combining circuit 33A is configured, is a substrate different from the substrate 62.

The output signal of the single amplifier 30A is inputted to differential input terminals 81 and 82, and the combined signal is outputted from a combined power output terminal 83. Note that, a back-surface line 92 in a section S1 is connected to a ground pattern 84 at a line end 85. The front-surface pattern in FIG. 9(A) is connected to the back-surface pattern in FIG. 9(B) at nodes 86 and 87, nodes 88 and 89, and nodes 90 and 91 via through vias.

The balun according to the example is an example of combining coupled circuits in three stages. In the case of the configuration shown in FIG. 9, the even-mode and odd-mode impedances in the entire balun circuit can be expressed by Equation (1) described above. Note that, in Equation (1) described above, $Z_{e1}$, $Z_{e2}$, and $Z_{e3}$ express the even-mode impedances of the coupled lines in the sections S1, S2, and S3, and $Z_{o1}$, $Z_{o2}$, and $Z_{o3}$ express the odd-mode impedances. In order to obtain excellent coupled characteristics in the balun in which an unbalanced-side port is grounded, the balun is designed so that a relation $Z_{e1}$, $Z_{e3} \gg Z_{e2}$ is held. In the example, in the sections S1 and S3, a suspended line (broadside-stacked line) configuration is formed, in which a relatively large even-mode impedance can be obtained. The coupled lines are formed with two lines formed opposite to the front surface and the back surface, and are disposed apart from a ground conductor as far as possible.

On the other hand, in the section S2, the coupled lines are embodied with coupled lines (edge coupled lines) formed of two microstrip lines (or strip lines) at a distance sufficiently apart from each other, compared with a distance to the ground conductor, and hence a relation $Z_{e1}$, $Z_{e3} \gg Z_{e2}$ is obtained.

Typically, a printed circuit board is used for such lines. The substrate is sandwiched between a grounded metal base and a cover. The back surface of the substrate is in intimate contact with the base. Therefore, in the sections S1 and S3, the substrate is recessed from the mounting surface of the substrate so that the base and the cover are sufficiently apart from the coupled lines. In the section S2, this processing is unnecessary.

Between the impedance $Z_{in}$ of the input terminal, to which the output signal of the single amplifier is inputted, and the output impedance $Z_{out}$ of the output terminal, from which the combined signal is outputted, Equation (2) describe above is held. $Z_{oo}$ is the combined impedance of the odd-mode impedances $Z_{o1}$, $Z_{o2}$, and $Z_{o3}$ in the sections S1, S2, and S3, which is expressed by Equation (1). These values are appropriately selected, and hence a desired impedance conversion rate can be achieved at the impedances $Z_{in}$ and $Z_{out}$ in a wide band.

For example, in the case in which the input impedance on the differential input side is 12.5 ohms and the output impedance on the combined output side is 50 ohms, in order to obtain a wide-band impedance response showing the Chebyshev characteristics, the odd-mode impedances in the sections S1, S2, and S3 are set to 22.9 ohms, 17.7 ohms, and 13.6 ohms, respectively, and hence a frequency response with an excellent Chebyshev response can be obtained.

Note that, in the example above, the description is made in the case in which the input impedance of the balun is 12.5 ohms. However, an impedance that can embody the transmission line width in the single amplifier can obtain similar effects regardless of the combination of impedances of 12.5 ohms and 50 ohms. The number of stages of the coupled circuit can be increased to any number. When the total number of stages is an odd number, the even-mode impedance of the odd-numbered coupled circuit only has to be increased much more than the even-mode impedance of the even-numbered coupled circuit, i.e. a large impedance $Z_e$ and a small impedance Ze only have to be alternately set.

As described above, the invention made by the present inventor is specifically described based on the embodiment and the example. However, the present invention is not limited to the foregoing embodiment and the example, and it is without saying that the present invention can be variously modified and altered.

REFERENCE SIGNS LIST

1: carrier amplifier,
2: peak amplifier,
3: 50-ohm load,
4R: impedance transformer,
5R: quarter-wavelength transmission line,
6: matching circuit,
7: phase compensation circuit,
8: matching circuit,
4S: impedance transformer matching circuit,
5S: quarter-wavelength transmission line,
10R, 10S: Doherty amplifier,
21, 22: power distribution circuit,
20: single amplifier,
23, 24: power combining circuit,
30, 30A: single amplifier,
31, 32, 32A: power distribution circuit,
33, 33A, 34: power combining circuit,
41, 41A: carrier amplifier,
42, 42A: peak amplifier,
44, 44A: impedance transformer,
45, 45A: quarter-wavelength transmission line,
47: phase compensation circuit,
47A: quarter-wavelength transmission line,
51, 52: differential input terminal,
53: combined power output terminal,
54, 55, 56: coupled line,
71: power distribution circuit,
72, 73: matching circuit,
74: carrier amplifier FET,
75: peak amplifier FET,
81, 82: differential input terminal,
83: combined power output terminal,
84: ground pattern,
100, 100A, 100S: power amplifier

The invention claimed is:

1. A power amplifier comprising:
a plurality of Doherty amplifiers for use in a Z-ohm system, and
a power combining circuit that includes a balun circuit and that combines output power of the plurality of Doherty amplifiers,
wherein each of the respective Doherty amplifiers comprises:
a carrier amplifier;
a peak amplifier; and
an impedance transformer line that converts a load of the carrier amplifier when an input signal is small,
wherein the impedance transformer line has a characteristic impedance smaller than Z ohms and equivalent to an optimum load impedance of the carrier amplifier,
wherein a load of the respective Doherty amplifier is smaller than Z ohms, and
wherein a load connected to a combined output terminal of the power combining circuit is Z ohms, and the balun circuit converts an impedance of the load of Z ohms so that an input impedance of an input terminal to which the respective Doherty amplifier is connected is an impedance smaller than Z ohms.

2. The power amplifier according to claim 1,
wherein: the Z ohms is 50 ohms, and
the optimum load impedance is five ohms or less.

3. The power amplifier according to claim 1,
wherein: the impedance transformer line is formed of a plurality of quarter-wavelength transformers in a cascade connection, and
the balun circuit is formed of a plurality of coupled circuits in a cascade connection.

4. The power amplifier according to claim 3,
wherein the plurality of coupled circuits of the balun circuit includes coupled lines with different characteristics.

5. The power amplifier according to claim 4,
wherein the balun circuit sets even-mode impedances in the plurality of coupled lines in a cascade connection so that levels of impedances are alternately changed in order of the cascade connection.

6. The power amplifier according to claim 5,
wherein a characteristic of the balun circuit is a Chebyshev response.

7. A power amplifier comprising:
a plurality of amplifiers; and
a power combining circuit that combines outputs of the plurality of amplifiers,
wherein: the plurality of amplifiers each includes
a distribution circuit that distributes an input signal inputted to an input signal terminal,
a carrier amplifier that is operated since the input signal is small,
a peak amplifier that starts operation when the input signal is high,
a phase compensation circuit that adjusts phases of an output of the carrier amplifier and an output of the peak amplifier,
a quarter-wavelength transmission line connected between the output of the carrier amplifier and the output of the peak amplifier, and
an impedance transformer connected to a node coupling the quarter-wavelength transmission line to the output of peak amplifier;
the carrier amplifier and the peak amplifier are each configured of a transistor having an optimum load impedance of five ohms or less;
the quarter-wavelength transmission line has a characteristic impedance equivalent to the optimum load impedance of the carrier amplifier smaller than five ohms, and the quarter-wavelength transmission line is directly connected to an output terminal of the carrier amplifier;
an input impedance of the power combining circuit is smaller than 50 ohms;
a load of 50 ohms is connected to an output terminal of the power combining circuit;
the quarter-wavelength transmission line and the impedance transformer are formed as a microstrip line or strip line on a first substrate, and
the power combining circuit is formed on a second substrate having a dielectric constant lower than a dielectric constant of the first substrate or having a thickness greater than a thickness of the first substrate.

8. The power amplifier according to claim 7,
wherein: the power amplifier is targeted to amplify a signal having an upper limit frequency almost two times a lower limit frequency or less, and
the power combining circuit includes a balun circuit that combines outputs of the plurality of amplifiers two each and that cancels a second-order harmonic produced in the plurality of amplifiers.

* * * * *